(12) United States Patent
Gogoi et al.

(10) Patent No.: US 7,232,701 B2
(45) Date of Patent: Jun. 19, 2007

(54) MICROELECTROMECHANICAL (MEM) DEVICE WITH A PROTECTIVE CAP THAT FUNCTIONS AS A MOTION STOP

(75) Inventors: Bishnu P. Gogoi, Scottsdale, AZ (US); Bernard Diem, Echirolles (FR)

(73) Assignee: Freescale Semiconductor, Inc., Austin, TX (US)

( * ) Notice: Subject to any disclaimer, the term of this patent is extended or adjusted under 35 U.S.C. 154(b) by 201 days.

(21) Appl. No.: 11/029,951

(22) Filed: Jan. 4, 2005

(65) Prior Publication Data
US 2006/0144143 A1 Jul. 6, 2006

(51) Int. Cl.
*H01L 21/00* (2006.01)

(52) U.S. Cl. ...................... 438/51; 73/514.01
(58) Field of Classification Search ................. 438/50, 438/51; 73/514.01
See application file for complete search history.

(56) References Cited

U.S. PATENT DOCUMENTS

| 5,181,156 | A | * | 1/1993 | Gutteridge et al. ...... 361/283.1 |
| 5,542,295 | A | | 8/1996 | Howe et al. |
| 5,914,521 | A | | 6/1999 | Gutteridge et al. |
| 6,214,243 | B1 | * | 4/2001 | Muenzel et al. ................ 216/2 |
| 6,228,275 | B1 | | 5/2001 | Koch et al. |
| 6,315,423 | B1 | * | 11/2001 | Yu et al. ..................... 359/872 |
| 6,318,174 | B1 | | 11/2001 | Schmiesing et al. |
| 6,805,008 | B2 | * | 10/2004 | Selvakumar et al. ..... 73/504.14 |

* cited by examiner

*Primary Examiner*—John E. Chapman
(74) *Attorney, Agent, or Firm*—Ingrassia Fisher & Lorenz

(57) ABSTRACT

A microelectromechanical (MEM) device includes a substrate, a structure, a travel stop, and a protective cap. The substrate has a surface, and the structure is coupled to, and movably suspended above, the substrate surface. The structure has at least an outer surface, and the travel stop coupled to the structure outer surface and movable therewith. The travel stop includes at least an inner peripheral surface that defines a cavity. The protective cap is coupled to the substrate and includes a stop section that is disposed at least partially within the travel stop cavity and is spaced apart from the travel stop inner peripheral surface. The travel stop and the protective cap stop section together limit movement of the structure in at least three orthogonal axes.

11 Claims, 6 Drawing Sheets

MICROELECTROMECHANICAL (MEM) DEVICE WITH A PROTECTIVE CAP THAT FUNCTIONS AS A MOTION STOP

TECHNICAL FIELD

The present invention generally relates to microelectromechanical (MEM) devices and, more particularly, to a MEM device that uses a wafer-level protective cap as a motion stop.

BACKGROUND

Many devices and systems include various numbers and types of sensors. The varied number and types of sensors are used to perform various monitoring and/or control functions. Advancements in micromachining and other microfabrication techniques and associated processes have enabled manufacture of a wide variety of microelectromechanical (MEM) devices, including various types of sensors. Thus, in recent years, many of the sensors that are used to perform monitoring and/or control functions are implemented using MEM sensors.

One particular type of MEM sensor that is used in various applications is an accelerometer. Typically, a MEM accelerometer includes, among other component parts, a proof mass that is resiliently suspended by one or more suspension springs. If the MEM accelerometer experiences an acceleration, the proof mass moves. The motion of the proof mass may then be converted into an electrical signal having a parameter magnitude (e.g., voltage, current, frequency, etc.) that is proportional to the acceleration.

If a MEM device, such as the above-described MEM accelerometer, experiences a relatively high acceleration, or is exposed to a relatively high force, the proof mass and/or other portions that make up the MEM device can move beyond a desired distance. In some instances, such movement can potentially damage the MEM device; Moreover, the MEM device can exhibit unstable behavior if the proof mass and/or other portions of the MEM device travel too far when a voltage is supplied to the MEM device. Thus, many MEM devices include one or more types of over travel stops or motion limiters that are configured to limit the movement of the proof mass and/or other portions of the MEM device. Such over travel stops include, for example, bumpers formed on the outer perimeter of the proof mass and/or other portions of the MEM device, and/or additional non-device structure.

Although presently-known devices and methods for limiting the travel of MEM device components are generally safe, reliably, and robust, these devices and methods do suffer certain drawbacks. For example, these devices and methods can be fairly complex and costly, and/or can consume an unwanted amount of surface area within the MEM device, and/or can only limit travel in one or two orthogonal axes.

Hence, there is a need for a MEM device, such as an accelerometer, and a method of making the same, that addresses one or more of the above-noted drawbacks. Namely, a device and method that limits over travel in a MEM device and that is less complex and/or costly as compared to present devices and methods, and/or consumes less surface area within the MEM device as compared to present devices and methods, and/or limits travel in at least three orthogonal axes. The present invention addresses one or more of these needs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. In this regard, although the invention is depicted and described in the context of an accelerometer, it will be appreciated that the invention at least could be used for any one of numerous devices that include a proof mass movably suspended above a substrate surface.

Figure 1:
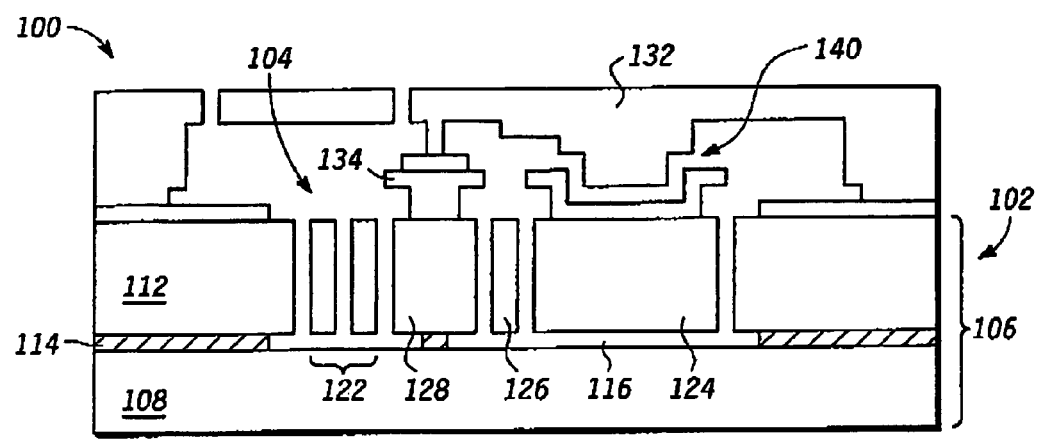
FIG. 1 is a simplified cross section view of an exemplary MEM device that may be made in accordance with an embodiment of the present invention.

Turning now to the description, and with reference first to FIG. 1, an exemplary microelectromechanical (MEM) device 100 is depicted. The depicted MEM device 100, which is shown in simplified cross section form, is an inertial sensor, such as an accelerometer, and includes an field region 102 and a sensor region 104 formed on an SOI (semiconductor-on-insulator) wafer 106. The SOI wafer 106, as is generally known, includes a handle layer 108, an active layer 112, and a sacrificial layer 114 disposed between the handle layer 108 and the active layer 112. The field region 102 and sensor region 104 are both formed in the active layer 112. The field region 102 is a region of the active layer 112 that remains affixed to the handle layer 108, via the sacrificial layer 114. Conversely, the sensor region 104, while being coupled to the field region 102, is also partially released from the handle layer 108. As will be described more fully below, during a release process, the sensor region 104 is partially undercut by removing portions the sacrificial layer 114 below the sensor region 104. This undercut forms a release trench 116, and releases portions of the sensor region 104 from the handle layer 108. The released portions of the sensor region 104 are thus suspended above the wafer 106.

The sensor region 104 includes a plurality of sensor elements, which may vary depending, for example, on the particular MEM sensor 100 being implemented. However, in the depicted embodiment, in which the MEM sensor 100 is an accelerometer, the sensor elements include a suspension spring 122, a structure 124, which in this case is a seismic mass, a moving electrode 126, and a fixed electrode 128. As is generally known, the suspension spring 122 resiliently suspends the seismic mass 124 and the moving electrode 126 above the handle layer 108. As was mentioned above, and will be described more fully below, during a release process, when the release trench 116 is formed in the wafer 106, the suspension spring 122, the seismic mass 124, and the moving electrode 126 are all released from the wafer 106, but the fixed electrode 128 remains affixed to the wafer 106. Thus, the suspension spring 122, seismic mass 124, and moving electrode 126 are suspended above the wafer.

For clarity and ease of illustration, it will be appreciated that the sensor region 104 is depicted in FIG. 1 to include only a single suspension spring 122, a single moving electrode 126, and a single fixed electrode 128. However, in a particular physical implementation, which is shown more clearly in FIG. 2, and which will now be described in more detail, the sensor region 104 includes a pair of suspension springs 122, a plurality of moving electrodes 126, and a plurality of fixed electrodes 128. The suspension springs 122 are each coupled between the field region 102 and the seismic mass 124 and, as was previously noted, resiliently suspend the seismic mass 124, when released, above the wafer 106. The moving electrodes 126 are each coupled to the seismic mass 124, and thus are also, when released, suspended above wafer 106. As FIG. 2 also shows, the moving electrodes 126 are each disposed between two fixed electrodes 128. The fixed electrodes 128, as was noted above, are not released. Rather, the fixed electrodes 128 remain anchored to the wafer 106, via a plurality of anchors 202.

Returning once again to FIG. 1, it is seen that the MEM device 100 additionally includes a protective cap 132. The protective cap 132 is coupled to the wafer 106, and extends over at least the sensor region 104 to provide physical protection thereof. In the depicted embodiment, the protective cap 132 is coupled to the field region 102 and/or one or more non-movable portions of the sensor region 104, such as one or more fixed electrodes 128, via a cap anchor 134. As will also be described more fully further below, following its formation, the protective cap 132 is partially spaced-apart from the sensor region 104 during the same release process that releases the sensor region 104.

Figure 2:
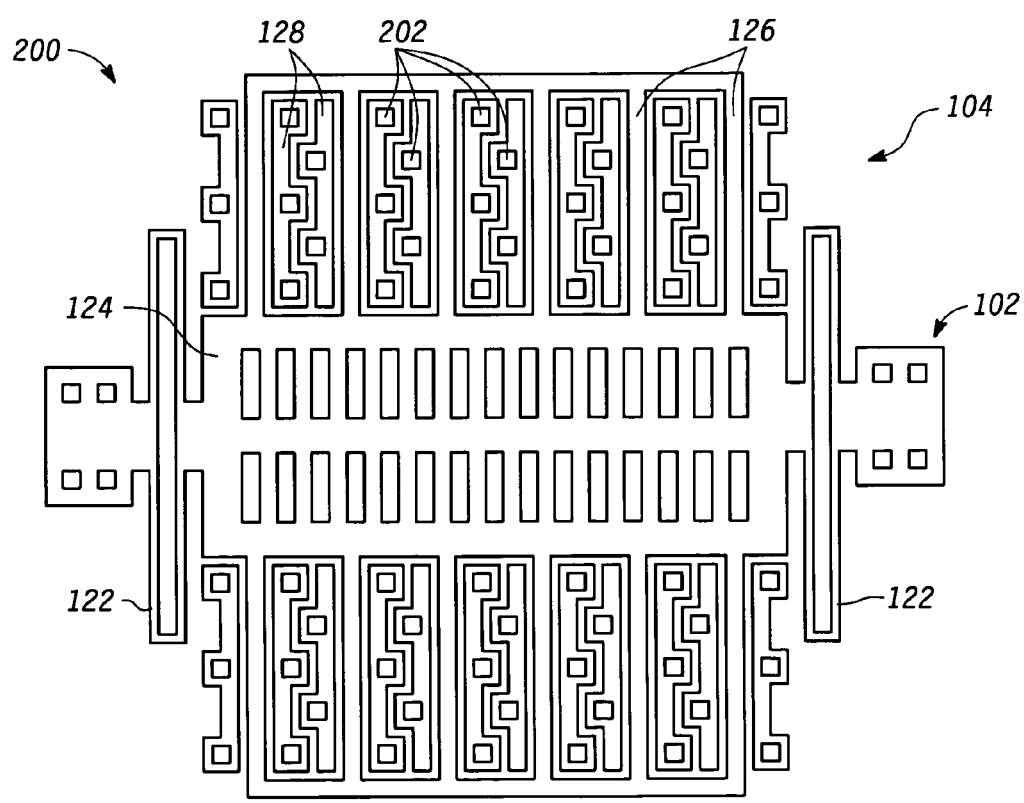
FIG. 2 is a top view of a physical implementation of the MEM device shown in FIG. 1 that may be manufactured according to the exemplary inventive process of the present invention.

The MEM devices 100, 200 constructed as shown in FIGS. 1 and 2, are implemented as capacitance type accelerometers. That is, when the device 100, 200 experiences an acceleration, the seismic mass 124 will move, due to the flexibility of the suspension springs 122, a distance that is proportional to the magnitude of the acceleration being experienced. The moving electrodes 126 are connected to the seismic mass 124, and will thus move the same distance as the seismic mass 124. The moving electrodes 126 and the fixed electrodes 128 adjacent each moving electrode 126 together form a variable differential capacitor. Thus, when the accelerometer 100, 200 experiences an acceleration, each moving electrode 126 will move toward one of the adjacent fixed electrodes 128 and away from another of the adjacent fixed electrodes 128. The distance that the moving electrodes 126 move will result in a proportional change in capacitance between the fixed electrodes 126 and the moving electrodes 128. This change in capacitance may be measured and used to determine the magnitude of the acceleration.

Figure 3:
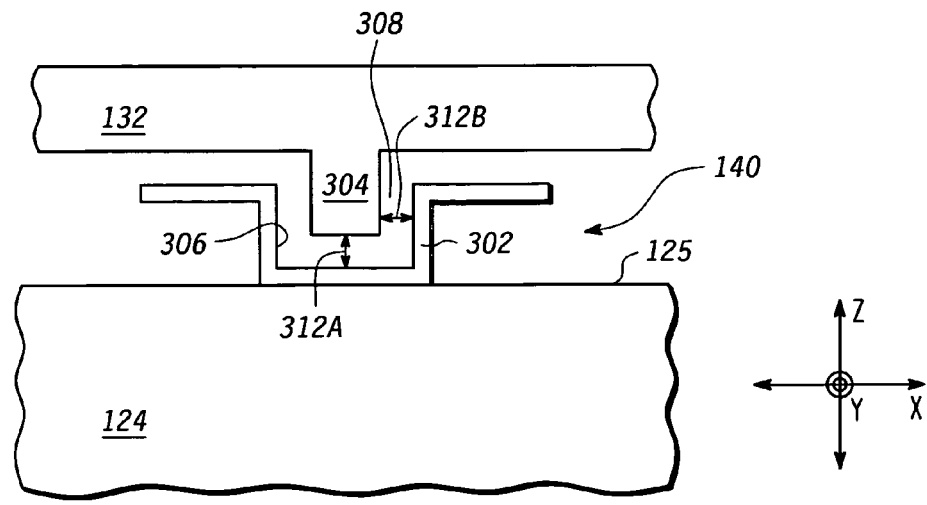
FIG. 3 is a close-up view of a portion of the MEM device shown in FIG. 1, showing an exemplary embodiment of an over travel stop according to an embodiment of the present invention.

As was previously noted, if the MEM device 100, 200 experiences a relatively high acceleration, or is exposed to a relatively high force, the seismic mass 124 and/or other moveable portions of the MEM device 100, 200 can move beyond a desired distance. In some instances, this movement can potentially damage the MEM device 100, 200 or cause the MEM device 100, 200 to exhibit unstable behavior. Thus, with reference once again to FIG. 1, it is seen that the MEM device 100 additionally includes an over travel stop 140. The over travel stop 140 is configured to limit the movement of the seismic mass 124, and thus other movable components of the MEM device 100, 200, such as the suspension springs 122, and the moving electrodes 126. A close-up view of the over travel stop 140 is shown in FIG. 3, and will now be described in more detail.

The over travel stop 140 includes two elements, a first stop element 302 and a second stop element 304. In the depicted embodiment, the first stop element 302 is referred to herein as a travel stop, and the second stop element 304 is a section of the protective cap 132, and is referred to herein as the stop section. The travel stop 302 is preferably coupled to the seismic mass 124. In this regard, it will be appreciated that the travel stop 302 may be formed on an outer surface 125 of the seismic mass 124 or be formed as an integral part of the seismic mass 124. It will additionally be appreciated that travel stop 302 could instead, or additionally, be formed on (or integrally with) any numerous other movable components in the sensor region 104. The travel stop 302, when formed, includes an inner peripheral surface 306 that defines a cavity 308. It will be appreciated that the travel stop cavity 308 may be configured into any one of numerous shapes, but in a preferred embodiment, it is substantially frusto-conically shaped or substantially cylindrically shaped.

The protective cap stop section 304 extends within the travel stop cavity 308, and is spaced a predetermined distance from the travel stop inner peripheral surface 306 to form a gap 312, both vertically 312a and laterally 312b, between the protective cap stop section 304 and the travel stop inner peripheral surface 306. Thus, the over travel stop 140 limits both vertical and lateral movement (i.e., movement along the orthogonal X-, Y-, and the Z-axes) of the seismic mass 124. The size of the vertical and lateral gaps 312a, 312b may vary depending, for example, on the particular MEM device 100 being implemented, its end use, and the amount of travel that needs to be limited in a particular direction. In one particular embodiment, in which the MEM device 100 is implemented as an accelerometer, the vertical gap 312a is about 0.5–1.0 μm and the lateral gap 312b is about 0.3–0.6 μm. It will additionally be appreciated that the lateral gap 312b may differ along the two horizontal orthogonal axes (i.e., the X-axis and Y-axis), or be equal along these two orthogonal axes.

In the above-described embodiment, the travel stop 302 is formed on (or otherwise coupled to) the seismic mass 124 (or other movable structure), and the stop section 304 is formed as part of (or otherwise coupled to) the protective cap 132. It will be appreciated that the over travel stop 140 could instead be implemented such that the travel stop 302 is formed as part of (or otherwise coupled to) the protective cap 132, and the stop section 304 is formed on (or otherwise coupled to) the seismic mass 124 (or other movable structure).

Having described an embodiment of a MEM device 100, 200 from a structural standpoint, a particular preferred process of forming the described MEM device 100, 200 will now be described. In doing so reference should be made, as appropriate, to FIGS. 4–12. It will be appreciated that, for clarity and ease of explanation, the process will be depicted and described using a simplified cross section view, similar to that shown in FIG. 1. However, it will be further appreciated that the process is applicable to the actual physical MEM device 200 illustrated in FIG. 2 and described above, as well as any one of numerous other MEM sensors that may be implemented. It will additionally be appreciated that although the method is, for convenience, described using a particular order of steps, the method could also be performed in a different order or using different types of steps than what is described below.

Figure 4:
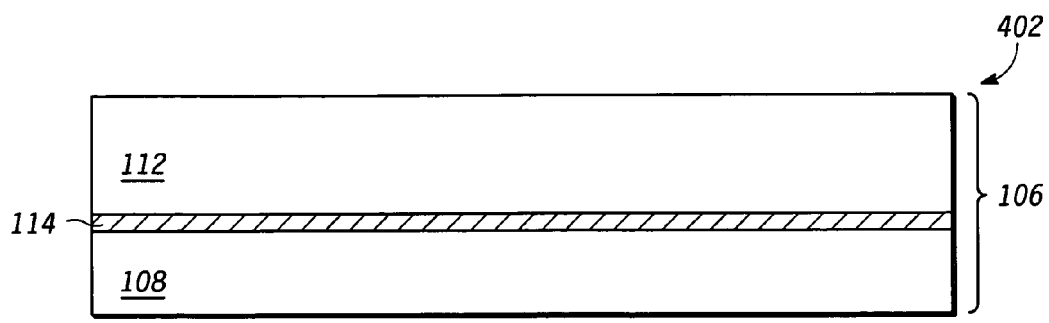
FIGS. 4–12 are simplified cross section views of the MEM device shown in FIG. 1, illustrating the various exemplary methodological steps that are used to make various MEM devices in accordance with an embodiment of the present invention.

With the above background in mind, and with reference first to FIG. 4, it is seen that the preferred starting material 402 for the process is an SOI wafer 106. Alternatively, the starting material 402 may be any one of numerous other articles including articles with a handle layer 108, an active layer 112, and an interposed sacrificial layer 114. No matter the specific type of starting material, the handle layer 108 and active layer 112 are each preferably made of silicon, though it will be appreciated that these layers could be made of other materials. It will be appreciated that the active layer 112 may be, for example, epitaxial silicon, or any other material from which the MEM sensor elements may be formed. The sacrificial layer 114 is preferably made of a material, such as silicon oxide, doped oxide, and doped silicate glass, just to name a few, that can be readily etched to release at least some of the sensor elements from the handle layer 108. It will be appreciated that the starting material 402 may include the handle layer 108, the active layer 112, and sacrificial layer 114 when obtained, or one or more of these layers may be formed as part of the overall process.

Figure 5:
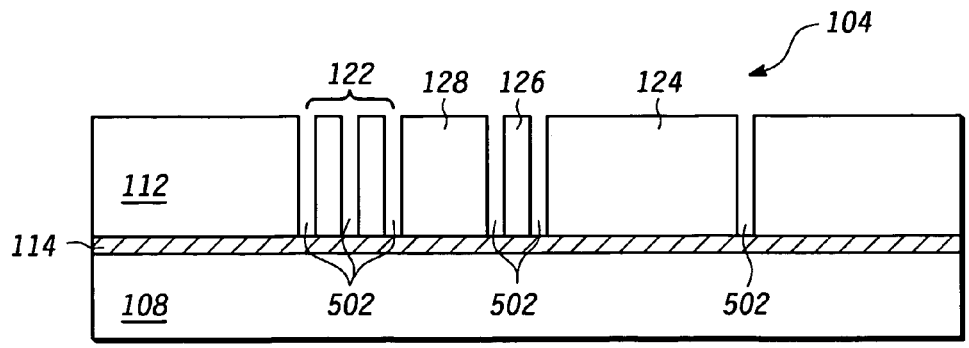

Having obtained (or prepared) the starting material 402, and as shown in FIG. 5, the active layer 112 is then patterned and etched to define the field region 102 and the sensor region 104 therein. It will be appreciated that any one of numerous patterning and etching processes may be used; however, in a preferred embodiment, a dry reactive ion etch (DRIE) process is used. No matter the specific process that is used, it results in a plurality of etch openings 502 being formed in the sensor region 104, which define the structural features of the individual sensor elements. One or more etch openings 502 may also be formed in selected ones of the sensor elements, such as the suspension spring 122, and the seismic mass 124. It will be appreciated that for clarity and ease of explanation, an etch opening 502 in the seismic mass 124 is not depicted. No matter the specific location, the etch holes 502 each provide access to the sacrificial layer 114, whereby the release of a portion of the sensor region 104 is effected. The size and number of etch openings 502, both in and between the sensor elements, are at least partially selected to implement the desired sequence and/or timing of the release of the sensor elements. Moreover, the number and spacing of the etch openings 502 in the seismic mass 124 are selected to achieve, among other things, desired response characteristics.

Figure 6:
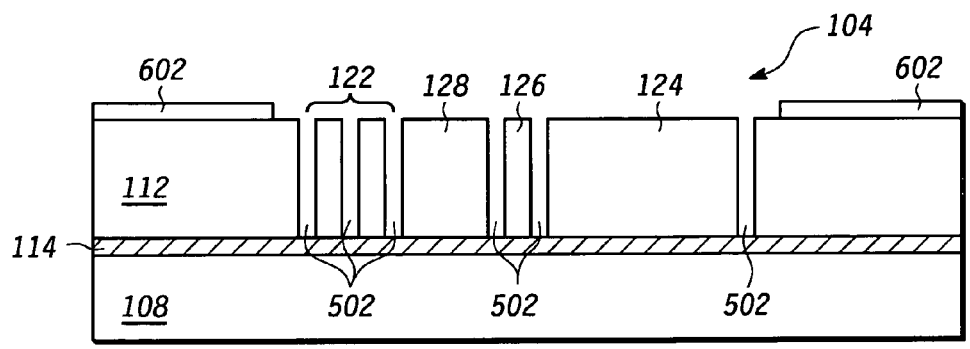

Once the etch openings 502 in the sensor region 104 are formed, as is shown more clearly in FIG. 6, a first layer of electrical isolation material 602 is deposited onto at least the field region 102 and, if necessary, selectively patterned or etched. The first layer of electrical isolation material 602 is used to provide electrical isolation between the protective cap 132 and the field region 102. In a particular preferred embodiment, the first layer of electrical isolation material 602 comprises silicon nitride. However, it will be appreciated that the first layer of electrical isolation material 602 may be implemented using any one of numerous suitable materials now known or developed in the future including, for example, low stress silicon rich silicon nitride.

Figure 7:
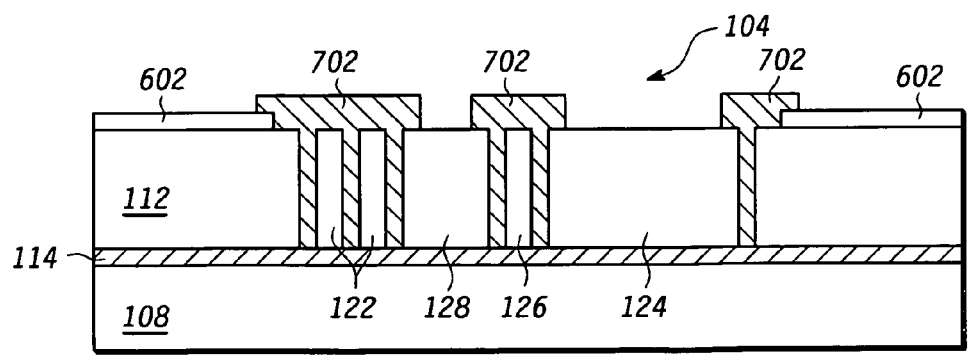

Thereafter, and with reference to FIG. 7, a sacrificial material 702 is deposited (or formed) in each of the etch openings 502, over portions of the first layer of electrical isolation material 602, and over selected portions of the sensor region 104. For example, in the depicted embodiment, the sacrificial material 702 is deposited over the suspension spring 122, the moving electrode 126, portions of the fixed electrode 128, and portions of the seismic mass 124. The first layer of sacrificial material 702 may comprise any one of numerous types of readily etchable materials such as, for example, $SiO_2$, borosilicate glass (BSG), borophosphosilicate glass (BPSG), tetraethoxysilicate (TEOS), and undoped silicon glass (USG). Moreover, it will be appreciated that in some embodiments the first layer of sacrificial material 702 may comprise the same material as that of the sacrificial layer 114. However, in the preferred embodiment, the first layer of sacrificial material 702 is phosphosilicate glass (PSG). Nonetheless, it will be further appreciated that the exact choice of material for the first layer of sacrificial material 702 for a given application may depend, for example, on such factors as the composition of the various sensor components 102 and other structural features that will be present on the MEM device 100, 200 at the time that the release of the sensor region 104 is carried out, the specific etchant that is used, and the selectivity of the etchant to the materials of these features or components 102.

Figure 8:
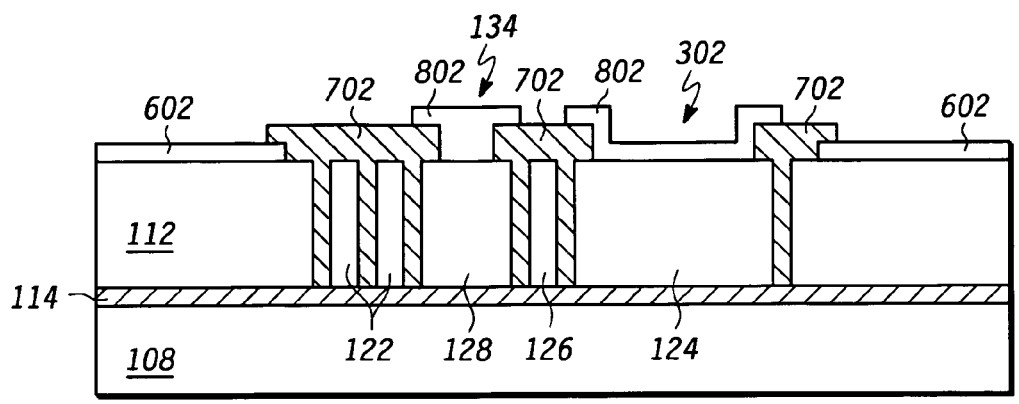

Those portions of the seismic mass 124 and fixed electrode 128 that do not include the first layer of sacrificial material 702 define regions on which a layer of an additional material 802 will be deposited (or formed). As shown in FIG. 8, this layer of additional material 802 is used to define the travel stop 302 and the cap anchor 134 the layer of additional material 802 may comprise any one of numerous known materials that are compatible with the substrate active layer 112. For example, the layer of additional material 802 may comprise a metal or an intermetallic such as, for example, aluminum, copper, tungsten, titanium, gold, nickel, or permalloy. In a particular preferred embodiment, however, the layer of additional material 802 comprises polycrystalline silicon, which may be doped as-deposited or doped after being deposited. No matter the particular material that is used for this layer of additional material 802, following is deposition (or formation) it is preferably patterned or etched into the desired shapes for the travel stop 302 and cap anchor 134.

Figure 9:
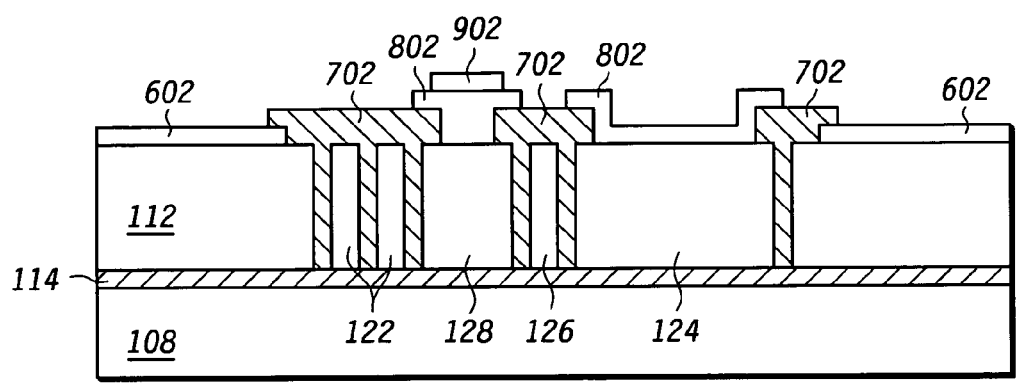

With the travel stop 302 and cap anchor 134 shapes appropriately patterned into layer 802, a second layer of electrical isolation material 902, which is shown in FIG. 9, is deposited (or formed) onto at least the cap anchor 134 and, if necessary, selectively patterned or etched. The second layer of electrical isolation material 902 is used to provide electrical isolation between the protective cap 132 and the cap anchor 134. In a particular preferred embodiment, the second layer of electrical isolation material 902 comprises the same material as the first layer of electrical isolation material 602. However, as with the first layer of electrical isolation material 602, it will be appreciated that it could be implemented using any one of numerous suitable materials now known or developed in the future.

Figure 10:
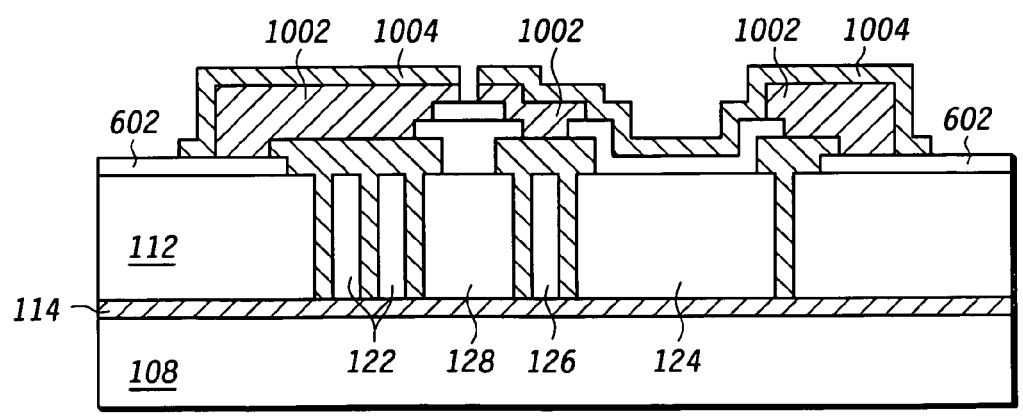

Following deposition of the second layer of electrical isolation material 902, and as shown in FIG. 10, two additional layers of sacrificial material 1002, 1004 are deposited (or formed) and, if necessary, patterned or etched. The second and third layers of sacrificial material 1002, 1004, when subsequently removed, selectively release the protective cap 132 from portions of the field region 102, the suspension spring 122, the moving electrode 126, the cap anchor 134, and portions of the travel stop 302. In addition, it is seen that the third layer of sacrificial material 1004 is preferably deposited (or formed) substantially uniformly over the second layer of sacrificial material 1002 and over that portion of the layer of additional material 802 that defines the travel stop 302. As such, the third layer of sacrificial material 1004 defines the dimensions of the vertical and lateral gaps 312a, 312b, and thus the predetermined distance between the travel stop 302 and the protective cap stop section 304. The second and third layers of sacrificial material 1002, 1004 are preferably each similar to the first layer of sacrificial material 702, and as such preferably comprise PSG. Nonetheless, it will be appreciated that one or both of these layers 1002, 1004 could comprise any one of numerous other sacrificial materials.

Figure 11:
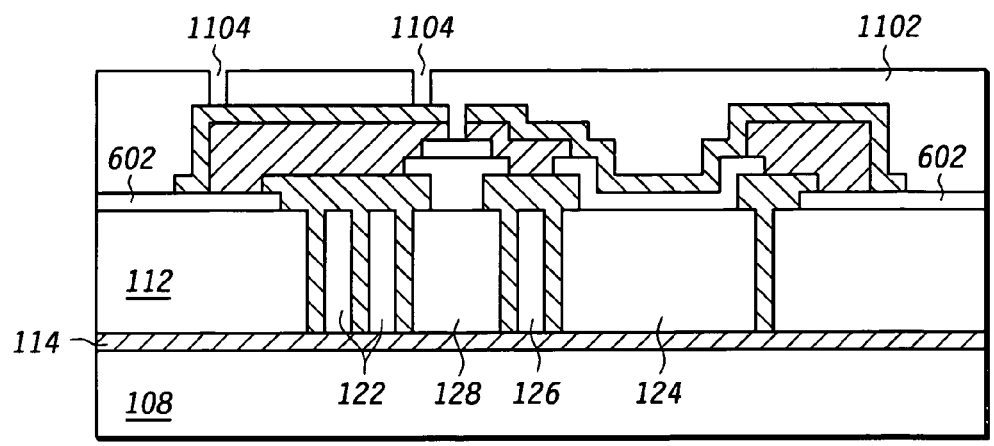

With reference now to FIG. 11, a top layer of, for example, polycrystalline silicon 1102, which may be doped as-deposited or doped after being deposited, is deposited over the third layer of sacrificial material 1004. This top layer of polycrystalline silicon 1102, which is partially released upon removal of the first, second, and third layers of sacrificial material 702, 1002, 1004, defines the protective cap 132. As FIG. 11 also shows, the top layer of polycrystalline silicon 1102 is deposited to include a plurality of etch holes 1104, through which an etchant may flow to thereby selectively etch away the first, second, and third layers of sacrificial material 702, 1002, and 1004.

Figure 12:
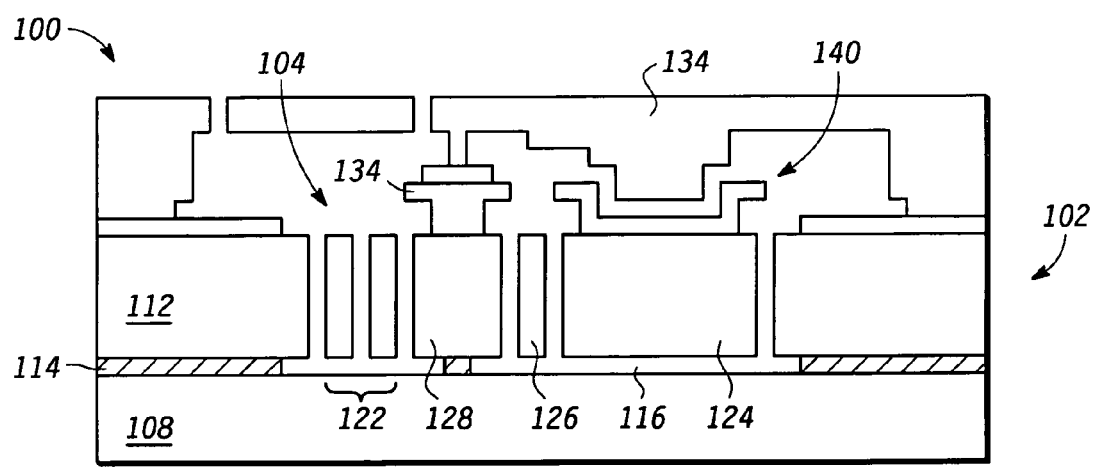

Various etch processes could be used to etch away the first, second, and third layers of sacrificial material 702, 1002, and 1004. For example, a wet etch process or a vapor phase etch process could be used. In a preferred embodiment, a wet etch process is used, and a wet etch solution, such as an aqueous hydrofluoric acid (HF) solution, is introduced into the etch holes 1104 in the top layer of polycrystalline silicon 1102. No matter the specific etch process that is implemented, upon completion of the etch process, and as shown in FIG. 12, the MEM device 100 is formed, in which a portion of the protective cap 132 forms part of the over travel stop 140. It will be appreciated that additional process steps may be implemented to complete device 100 formation. However, the description of these additional steps is not needed to enable or understand the present invention and will, therefore, not be further described.

As was previously noted, although the above-described MEM devices 100, 200 are accelerometers, the manufacturing process described herein is not limited to accelerometers or any other type of sensor. But is applicable to any one of numerous MEM devices that include some type of structure that is movably suspended by one or more springs. Non-limiting examples of such devices include various types of gyroscopes and switches.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of forming a microelectromechanical (MEM) device on a substrate including a handle layer, an active layer, and a sacrificial layer disposed at least partially therebetween, the method comprising the steps of:

forming at least a structure in the active layer;

removing at least a portion of the sacrificial layer to thereby release the structure from the substrate;

forming a first stop element on the structure, the first stop element defining a travel stop that includes at least an inner peripheral surface that defines a cavity; and forming a protective cap over at least a portion of the travel stop, the protective cap including a second stop element spaced apart from the first stop element and defining a stop section disposed at least partially within the travel stop cavity.

2. The method of claim 1, further comprising:

forming a plurality of etch openings in the active layer to thereby form the structure therein;

forming a layer of sacrificial material into the etch openings and over a portion of the structure outer surface; and following formation of the first stop element, exposing the formed layer of sacrificial material and the sacrificial layer to an etchant, whereby the first layer of sacrificial material and the sacrificial layer are removed.

3. The method of claim 1, further comprising:

forming a layer of sacrificial material over at least a portion of the first stop element, the layer of sacrificial material having a predetermined thickness that, upon removal thereof, defines a predetermined distance between the first and second stop elements.

4. The method of claim 1, further comprising:

forming a layer of electrical isolation material on at least a portion of the active layer;

forming the protective cap on the layer of electrical isolation material.

5. The method of claim 1, further comprising:

forming a plurality of etch openings in the active layer to thereby form the structure therein;

forming a first layer of sacrificial material in the etch openings and over a portion of the structure outer surface;

following formation of the first stop element, forming a second layer of sacrificial material over the first layer of sacrificial material and over a portion of the first stop element;

forming a third layer of sacrificial material over the second layer of sacrificial material, the third layer of sacrificial material having a predetermined thickness that, upon removal thereof, defines a predetermined distance between the first and second stop elements; and following formation of the first stop element, exposing the first, second, and third layers of sacrificial material and the sacrificial layer to an etchant, whereby the first, second, and third layers of sacrificial material and the sacrificial layer are removed.

6. The method of claim 1, wherein the protective cap stop section is spaced:

a first predetermined distance from the travel stop inner peripheral surface along a first of the three orthogonal axes;

a second predetermined distance from the travel stop inner peripheral surface along a second of the three orthogonal axes; and a third predetermined distance from the travel stop inner peripheral surface along a third of the three orthogonal axes.

7. The method of claim 6, wherein at least the first and second predetermined distances are substantially equivalent.

8. The method of claim 6, wherein the first, second, and third predetermined distances are substantially equivalent.

9. The method of claim 1, wherein:
the MEM device is an accelerometer; and
the structure is a seismic mass.

10. The method of claim 1, wherein:
the formed structure includes an outer surface; and
the first stop element is formed on the structure outer surface.

11. A method of forming a microelectromechanical (MEM) device on a substrate including a handle layer, an active layer, and a sacrificial layer disposed at least partially therebetween, the method comprising the steps of:
forming at least a structure in the active layer;
removing at least a portion of the sacrificial layer to thereby release the structure from the substrate;
forming a first stop element on the structure;
forming a protective cap over at least a portion of the first stop element, the protective cap including a second stop element spaced apart from the first stop element;
forming a plurality of etch openings in the active layer to thereby form the structure therein;
forming a first layer of sacrificial material in the etch openings and over a portion of the structure outer surface;
following formation of the first stop element, forming a second layer of sacrificial material over the first layer of sacrificial material and over a portion of the first stop element;
forming a third layer of sacrificial material over the second layer of sacrificial material, the third layer of sacrificial material having a predetermined thickness that, upon removal thereof, defines a predetermined distance between the first and second stop elements; and
following formation of the first stop element, exposing the first, second, and third layers of sacrificial material and the sacrificial layer to an etchant, whereby the first, second, and third layers of sacrificial material and the sacrificial layer are removed.

* * * * *